(12) United States Patent
Spruit et al.

(10) Patent No.: US 11,092,531 B2
(45) Date of Patent: Aug. 17, 2021

(54) OPTICAL PARTICLE SENSOR

(71) Applicant: TRUMPF Photonic Components GmbH, Ulm (DE)

(72) Inventors: Johannes Henrikus Maria Spruit, Waalre (NL); Petrus Theodorus Jutte, Weert (NL); Alexander Marc Van Der Lee, Venlo (NL); Holger Joachim Moench, Vaals (NL); Joachim Wilhelm Hellmig, Valkenswaard (NL)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 347 days.

(21) Appl. No.: 16/300,594

(22) PCT Filed: May 17, 2017

(86) PCT No.: PCT/EP2017/061817
§ 371 (c)(1),
(2) Date: Nov. 12, 2018

(87) PCT Pub. No.: WO2017/198699
PCT Pub. Date: Nov. 23, 2017

(65) Prior Publication Data
US 2020/0309661 A1 Oct. 1, 2020

(30) Foreign Application Priority Data
May 19, 2016 (EP) .................................... 16170306

(51) Int. Cl.
*G01N 15/02* (2006.01)
*G01N 15/14* (2006.01)
(Continued)

(52) U.S. Cl.
CPC ..... *G01N 15/0205* (2013.01); *G01N 15/1434* (2013.01); *H01S 5/183* (2013.01); *G01N 2015/0003* (2013.01)

(58) Field of Classification Search
CPC .......... G01N 15/0205; G01N 15/1434; G01N 2015/0003; G01N 2015/1454; G01P 5/26;
(Continued)

(56) References Cited

U.S. PATENT DOCUMENTS 6,023,485 A 2/2000 Claisse et al.
6,233,045 B1 5/2001 Suni et al.
(Continued)

FOREIGN PATENT DOCUMENTS

CN 101055224 A 10/2007
CN 101910867 A 12/2010
(Continued)

OTHER PUBLICATIONS

Giuliani et al "Laser Diode Self-Mixing Technique for Sensing Applications" Journal of Optics a Pure and Applied Optics 2002, p. 283-294.

*Primary Examiner* — Tri T Ton
(74) *Attorney, Agent, or Firm* — Leydig, Voit & Mayer, Ltd.

(57) ABSTRACT

The invention describes a laser sensor module. The laser sensor module comprises at least a first laser (111) being adapted to emit a first measurement beam (111') and at least a second laser (112) being adapted to emit a second measurement beam (112'). The laser sensor module further comprises an optical device (150) being arranged to redirect the first measurement beam (111') and the second measurement beam (112') such that the first measurement beam (111') and the second measurement beam enclose an angle between 45° and 135°. The laser sensor module comprises
(Continued)

one detector (120) being adapted to determine at least a first self-mixing interference signal of a first optical wave within a first laser cavity of the first laser (111) and at least a second self-mixing interference signal of a second optical wave within a second laser cavity of the second laser (112). This configuration enables determination of an average velocity of the particles despite of the fact that it is not possible to determine the components of the velocity vector. The introduced error by means of statistical variations is acceptable because the number of detected particles scales with the cubic root of the particle velocity. The invention further describes a particle sensor (100) comprising such a laser sensor module, a corresponding method and computer program product. The invention enables a simple and low-cost particle sensor (100) for detecting small particles based on laser self-mixing interference.

20 Claims, 10 Drawing Sheets

(51) Int. Cl.
*H01S 5/183* (2006.01)
*G01N 15/00* (2006.01)

(58) Field of Classification Search
CPC ........ G01S 17/58; G01S 17/87; G01S 7/4812; G01S 7/4916; H01S 5/0028; H01S 5/02292; H01S 5/0656; H01S 5/183; H01S 5/423
USPC .................................................. 356/335–343
See application file for complete search history.

(56) References Cited

U.S. PATENT DOCUMENTS

| | | |
|---|---|---|
| 2010/0187449 A1 | 7/2010 | Schemmann et al. |
| 2011/0007299 A1 | 1/2011 | Schemmann et al. |
| 2011/0285984 A1 | 11/2011 | Christian et al. |
| 2013/0294645 A1 | 11/2013 | Sibarita |
| 2019/0285537 A1* | 9/2019 | Spruit ................ G01N 15/1434 |

FOREIGN PATENT DOCUMENTS

| | | |
|---|---|---|
| CN | 102297823 A | 12/2011 |
| CN | 102564909 A | 7/2012 |
| CN | 103940707 A | 7/2014 |
| CN | 104285175 A | 1/2015 |
| EP | 1334464 B1 | 8/2003 |
| EP | 2171811 A2 | 4/2010 |
| EP | 2388614 A3 | 1/2012 |
| WO | 02370410 A1 | 5/2002 |
| WO | WO 2009001283 A2 | 12/2008 |

\* cited by examiner

OPTICAL PARTICLE SENSOR

CROSS-REFERENCE TO PRIOR APPLICATIONS

This application is the U.S. National Phase application under 35 U.S.C. § 371 of International Application No. PCT/EP2017/061817, filed on May 17, 2017, which claims the benefit of EP Patent Application No. EP 16170306.1, filed on May 19, 2016. These applications are hereby incorporated by reference herein.

FIELD OF THE INVENTION

The invention relates to a laser sensor or laser sensor module using self-mixing interference for particle density detection, a related method of particle density detection and a corresponding computer program product. The invention further relates to a device comprising such a laser sensor or laser sensor module.

BACKGROUND OF THE INVENTION

CN102564909 A discloses a laser self-mixing multi-physical parameter measurement method and a laser self-mixing multi-physical parameter measurement device for atmospheric particulate matter. The laser self-mixing multi-physical parameter measurement device comprises a microchip laser, a collimating lens, a beam splitter, converging lenses, a photodetector, an amplifier, a data acquisition card and a spectrum analyzer. The described methods and devices are complicated and expensive.

SUMMARY OF THE INVENTION

It is an object of the present invention to provide an improved laser sensor module for particle density detection. The invention is defined by the independent claims. The dependent claims define advantageous embodiments.

According to a first aspect a laser sensor module for particle density detection is presented. The laser sensor module comprises:
  at least a first laser being adapted to emit a first measurement beam and at least a second laser being adapted to emit a second measurement beam,
  an optical device being arranged to redirect at least the first measurement beam such that the first measurement beam and the second measurement beam enclose an angle between 45° and 135°,
  one detector being adapted to determine at least a first self-mixing interference signal of a first optical wave within a first laser cavity of the first laser and at least a second self-mixing interference signal of a second optical wave within a second laser cavity of the second laser.

The number of detected particles determined by means of optical sensing techniques depends on the relative velocity of the particles with respect to the optical beam. It is therefore necessary to determine the velocity of the particles in order to determine the corresponding particle density. In the general case of an unknown wind direction multiple self-mixing laser sensors pointing in different directions, preferably orthogonally placed, must be used. Each of the self-mixing laser sensors emits a laser beam in the corresponding direction and a self-mixing interference signal is generated as soon as the laser beam is reflected at a particle such that at least a part of the reflected laser beam re-enters a laser cavity of the corresponding self-mixing laser sensor. A velocity component of the particle parallel to the emission direction of the laser beam can be determined by means of the self-mixing interference signal. Three self-mixing laser sensors emitting laser light in linear independent directions (preferably orthogonal directions as x, y, and z) are therefore necessary to determine the velocity vector of the particle flow. In other configurations, the direction of the particle flow has to be fixed with respect to the self-mixing laser sensor or an artificial particle flow has to be generated by means of, for example, a movable mirror such that the influence of the wind speed may be negligible. Especially movable mechanical parts as an oscillating mirror increase the size and cost of such particle sensor.

The laser sensor module with one common detector for detecting self-mixing interference signals of at least two lasers decrease the size, the complexity and therefore the cost of particle sensors. The detector is not arranged to differentiate which of the laser cavities generates the self-mixing interference signal. It is thus not possible to assign an emission direction to the determined self-mixing interference signal. A static optical device (no movable parts) is used to redirect one or both measurement beams such that the measurement beams enclose a fixed angle between 45° and 135°, more preferably between 60° and 120° and most preferably between 80° and 100°. A reliable velocity measurement can be determined from the single or common detector (e.g. photo diode). The reason is that the particle velocity would be derived in the known approach by the square root of the velocity components in x and y direction in case of a two-dimensional particle flow (e.g. wind parallel to a surface). Measurement of the velocity by means of only one detector which is not able to differentiate between the x and y direction therefore introduces an error. Because the number of detected particles scales with the cubic root of the particle velocity the error in number of particles is smaller than the error of the particle velocity. The simplified laser sensor module therefore enables for a multitude of applications a detection of the number of particles within a detection volume with sufficient accuracy. The number of particles within the detection volume may be used to determine the PM 2.5 value as defined by the National Air Quality Standard for Particulate Matter of the US Environmental Protection Agency. The signal strength of the self-mixing interference signals may be further used to determine an estimate of the particle sizes.

There may be two, three, four or more (e.g. array) of lasers emitting first measurement beams as well as two, three, four or more (e.g. array) of lasers emitting second measurement beams. Increasing the number of measurement beams may increase the detection volume and therefore decrease the detection time necessary to determine sufficient particles.

The laser sensor module may comprise at least a third laser being adapted to emit a third measurement beam. The optical device may be arranged such that at least two measurement beams are redirected such that all measurement beams mutually enclose the same angle. The optical device may especially be arranged to redirect the first measurement beam, the second measurement beam and the third measurement beam such that the first measurement beam and the second measurement beam enclose the same angle as the second measurement beam and the third measurement beam and as the third measurement beam and the first measurement beam. The single detector may be adapted to determine at least an additional third self-mixing interference signal of a third optical wave within a third laser cavity of the third laser. The single detector is therefore arranged to determine the self-mixing interference signal of all three lasers. The laser sensor module is therefore simplified in comparison to a configuration in which separate detectors are combined with each laser.

Taking three lasers which are arranged by means of the optical device to emit three measurement beams in three linear independent measurement directions enables to determine an average velocity if the particle flow vector is not restricted to an essentially two-dimensional plane as in case of a laser sensor module with two measurement beams described above. It is therefore possible to determine the number of particles in a detection volume by means of such a simple laser sensor module even in case of an unknown three-dimensional particle flow.

There may be two, three, four or more (e.g. array) of lasers emitting third measurement beams in order to increase the detection volume as described above.

The measurement beams may enclose an angle of 90°. Choosing essentially orthogonal measurement beams reduces the measurement error as discussed below and may thus be preferred. Two measurement beams may enclose an angle of 90° or three measurement beams may enclose an angle of 90° (e.g. measurement beams pointing in x, y, z direction Cartesian coordinate system).

The at least first laser and the at least second laser and even the third laser in case of a three-dimensional arrangement of measurement beams may consist of semiconductor layers provided on a common semiconductor chip.

The two or three lasers can be placed next to each other, for example, on a common semiconductor chip such that these lasers emit laser light in the same direction. The optical device changes the emission direction such that the two or three measurement beams enclose the desired angle or angles.

The common detector may be integrated in the semiconductor layers of the common semiconductor chip. The semiconductor layers of the semiconductor chip may comprise one or more photosensitive layers. The photosensitive layer (e.g. photo diode or photo transistor) may be arranged below an arrangement of the semiconductor layers building the at least two lasers. The photosensitive layer may be arranged such that variations of the optical wave within each laser cavity of the lasers can be detected. It is therefore possible to enable a very compact laser sensor module by means of the combination of the common semiconductor chip and the optical device. The lasers and the photosensitive layers can be manufactured on wafer level in one semiconductor process flow.

The optical device may comprise gratings optically coupled with the lasers. The optical device may alternatively comprise a surface grating integrated in the semiconductor layers or just above the semiconductor layers. The surface grating may comprise one or more structured semiconductor layers in the path of the emitted measurement beams which may be processed during semiconductor processing of the lasers and optionally the integrated common detector as described above. The gratings or surface gratings are arranged to deflect the measurement beams in the intended directions as described above and below.

The at least first laser and the at least second laser may, for example, be Vertically Cavity Surface Emitting Lasers (VCSEL). The common detector may in this case optionally be placed near to the laser cavity or integrated in the structure of the cavity (e.g. integrated in the layer structure of one of the mirrors) such that an optical coupling between the laser cavities of the lasers and the common detector is enabled.

Surface gratings may optionally be provided at a light emission side of the two, three or more VCSELs (top or bottom emitter) in order to enable or support deflection of the measurement beams.

The optical device may comprise micro-optical components for redirecting the measurement beams emitted by the lasers. Each micro-optical component may be attached to one laser or laser arrangement in order to redirect the respective measurement beam in the intended measurement direction. The micro-optical components may be attached to the lasers on wafer level in order to simplify alignment. The micro-optical components may be grouped in a common optical sub-device such that two, three, four or more micro-optical components can be attached to a laser sensor module comprising two, three, four or more lasers. One micro-optical component (optical array) may be used to redirect e.g. first measurement beams emitted by a first laser comprising an arrangement of two, three, four or more lasers (e.g. array).

The optical device may further comprise at least one focusing element associated to each measurement beam. The at least one focusing element is arranged to focus the respective measurement beam to a focus region. Focusing of the measurement beams to the respective focus regions may increase signal strength of the self-mixing interference signals. Reliability of the measurement may therefore be improved. The focusing element may, for example, be a lens.

The micro-optical components and the focusing elements may be manufactured in one integrated optical device in order to simplify alignment. One, two, three, four or more micro-optical components may be associated to one focusing element depending on the number of lasers used to emit the measurement beams in the respective measurement direction.

According to a further aspect a particle sensor is provided. The particle sensor comprises the laser sensor module according to any embodiment as described above. The laser sensor further comprises an evaluator. The evaluator may be adapted to receive detection signals generated by the detector in reaction to the determined self-mixing interference signals. The evaluator is further adapted to determine at least one average velocity of particles by means of the detection signals received in a predetermined time period. The evaluator is further adapted to determine a particle density based on the received detection signals in the predetermined time period and the at least one average velocity.

The combination of number of detected particles and the detected velocity results in a particle density. The particle density can be expressed for instance as a PM2.5 value. The evaluator may, for example, comprise only one ASIC which is adapted to evaluate the self-mixing interference signals generated by means of first, second and optionally third laser in combination with the common detector as described in more detail below.

The particle sensor may further comprise an electrical driver. The electrical driver may be adapted to electrically drive the lasers such that the lasers emit the measurement beams.

The particle sensor may additionally comprise an interface by means of which control signals, electrical driving signals or detection signals can be exchanged with an external controller.

An air purifier, a sensor box or a wearable device may comprise the particle sensor module according to any embodiment as described above. The sensor box may be a particle sensor as described above or a device comprising several mutually different sensor modules or sensors. The wearable device may, for example, be a mobile communication device as a smart phone.

According to a further aspect a method of particle density detection is presented. The method comprises the steps of:
- emitting at least a first measurement beam by means of a first laser,
- emitting at least a second measurement beam by means of a second laser,
- redirecting at least the first measurement beam such that the first measurement beam and the second measurement beam enclose an angle between 45° and 135°,
- determining self-mixing interference signals of at least a first optical wave within a first laser cavity of the first laser and at least a second optical wave within a second laser cavity of the second laser by means of one detector within a predetermined time period,
- determining at least one average velocity based on the determined self-mixing interference signals,
- determining a particle density based on the determined average velocity and a number of determined self-mixing interference signals.

The method may further comprise the additional steps of:
- determining at least a first average velocity based on self-mixing interference signals determined in a first time period,
- determining at least a second average velocity based on self-mixing interference signals determined in a second time period,
- determining the number of determined self-mixing interference signals in the predetermined time period comprising the first and the second time period,
- determining the particle density based on the at least first average velocity, the at least second average velocity and the corresponding number of determined self-mixing interference signals.

The method steps are not necessarily performed in the sequence described above.

The number of self-mixing interference signals is determined in the corresponding time periods. The interval for particle detection may be optimized according to this method for most accurate results. For small time interval the wind speed is most accurately followed. For large time interval the number of detected particles is larger and consequently the measurement errors are smaller. By using a longer averaging time (time period comprising the first and the second time period) for the number of particles and a shorter averaging time (first respectively second time period) for the momentary wind speed (and consequently momentary correction factor on particle count) most accurate results may be obtained.

According to a third aspect a computer program product is presented. The computer program product comprises code means which can be saved on at least one memory device of the particle sensor according to any one of claims 8 to 9 or on at least one memory device of a device comprising the particle sensor. The code means being arranged such that the method according to claim 11 or 12 can be executed by means of at least one processing device of the laser sensor according to any one of claims 8 to 9 or by means of at least one processing device of the device comprising the laser sensor.

The memory device or the processing device may be comprised by the laser sensor (e.g. electrical driver, evaluator etc.) or the device comprising the laser sensor module. A first memory device and/or first processing device of the device comprising the laser sensor module may interact with a second memory device and/or second processing device comprised by the laser sensor module.

The memory device or devices may be any physical device being arranged to store information especially digital information. The memory device may be especially selected out of the group solid-state memory or optical memory.

The processing device or devices may be any physical device being arranged to perform data processing especially processing of digital data. The processing device may be especially selected out of the group processor, microprocessor or application-specific integrated circuit (ASIC).

It shall be understood that the laser sensor according to any one of claims eight or nine and the method of claim 11 or 12 have similar and/or identical embodiments, in particular, as defined in the dependent claims.

It shall be understood that a preferred embodiment of the invention can also be any combination of the dependent claims with the respective independent claim.

Further advantageous embodiments are defined below.

These and other aspects of the invention will be apparent from and elucidated with reference to the embodiments described hereinafter.

DETAILED DESCRIPTION OF EMBODIMENTS

Figure 1:
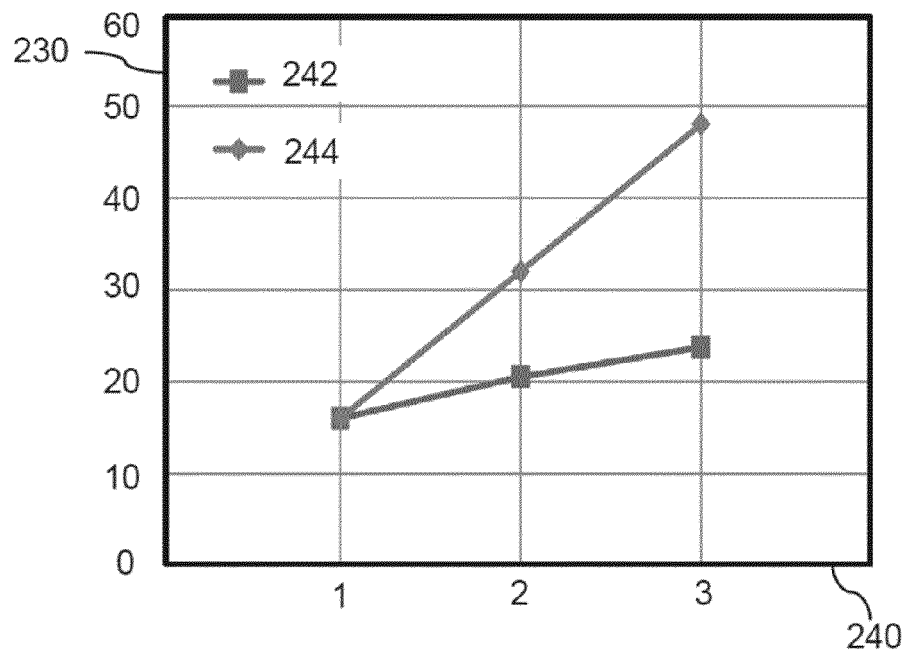
FIG. 1 shows a number of detected particles as function of the number of lasers

Various embodiments of the invention will now be described by means of the Figures.

Self-mixing interference is used for detecting movement of and distance to an object. Background information about self-mixing interference is described in "Laser diode self-mixing technique for sensing applications", Giuliani, G.; Norgia, M.; Donati, S. & Bosch, T., Laser diode self-mixing technique for sensing applications, Journal of Optics A: Pure and Applied Optics, 2002, 4, S. 283-S. 294 which is incorporated by reference. Detection of movement of a fingertip relative to a sensor in an optical input device is described in detail in International Patent Application No. WO 02/37410 which is incorporated by reference. The principle of self-mixing interference is discussed based on the examples presented in International Patent Application No. WO 02/37410. A diode laser having a laser cavity is provided for emitting a laser, or measuring, beam. At its upper side, the device is provided with a transparent window across which an object, for example a human finger, is moved. A lens is arranged between the diode laser and the window. This lens focuses the laser beam at or near the upper side of the transparent window. If an object is present at this position, it scatters the measuring beam. A part of the radiation of the measuring beam is scattered in the direction of the illumination beam and this part is converged by the lens on the emitting surface of the laser diode and re-enters the cavity of this laser. The radiation re-entering the cavity of the diode laser induces a variation in the gain of the laser and thus in the intensity of radiation emitted by the laser, and it is this phenomenon which is termed the self-mixing effect in a diode laser.

The change in intensity of the radiation emitted by the laser or of the optical wave in the laser cavity can be detected by a photo diode or a detector arranged to determine an impedance variation across the laser cavity. The diode or impedance detector converts the radiation variation into an electric signal, and electronic circuitry is provided for processing this electric signal.

The self-mixing interference signal may in case of particle detection, for example, be characterized by a short signal burst or a number of signal bursts. It may therefore be preferred to use a DC drive current in order to simplify signal detection and signal analysis. A modulated drive current may be used in order to determine the position or velocity of the particle, for example, by means of self-mixing interference signals which may be generated by reflection of laser light at bigger particles. The velocity (and optionally distance) may be determined within one measurement or in a subsequent measurement step. It may therefore be possible or even beneficial to use a DC drive current in a first period in time in order to generate a particle measure of the intended particle number or size and a modulated drive current in order to determine the velocity of the particle flow. The duration and the intensity of the signal may optionally be used to determine the particle size.

Figure 2:
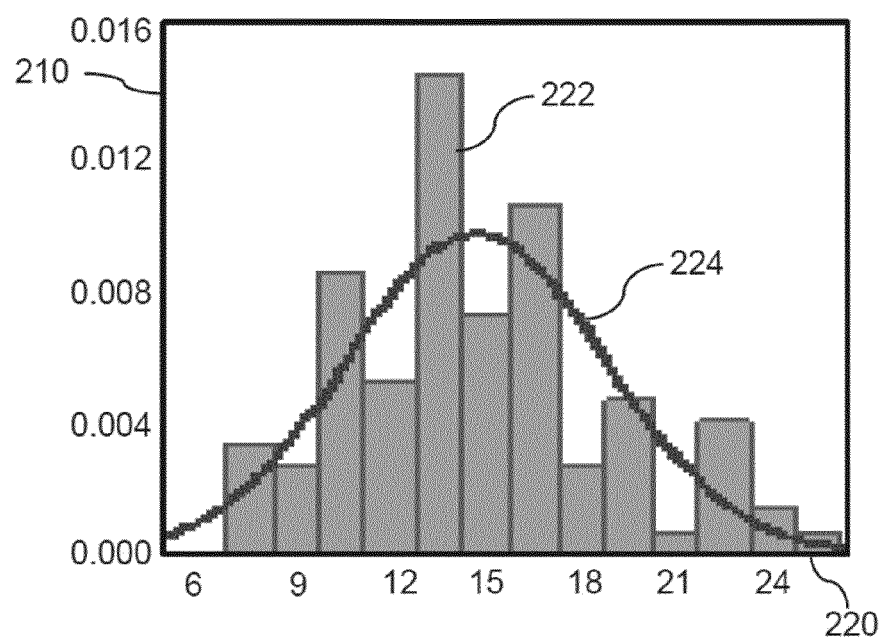
FIG. 2 shows a probability distribution
Figure 3:
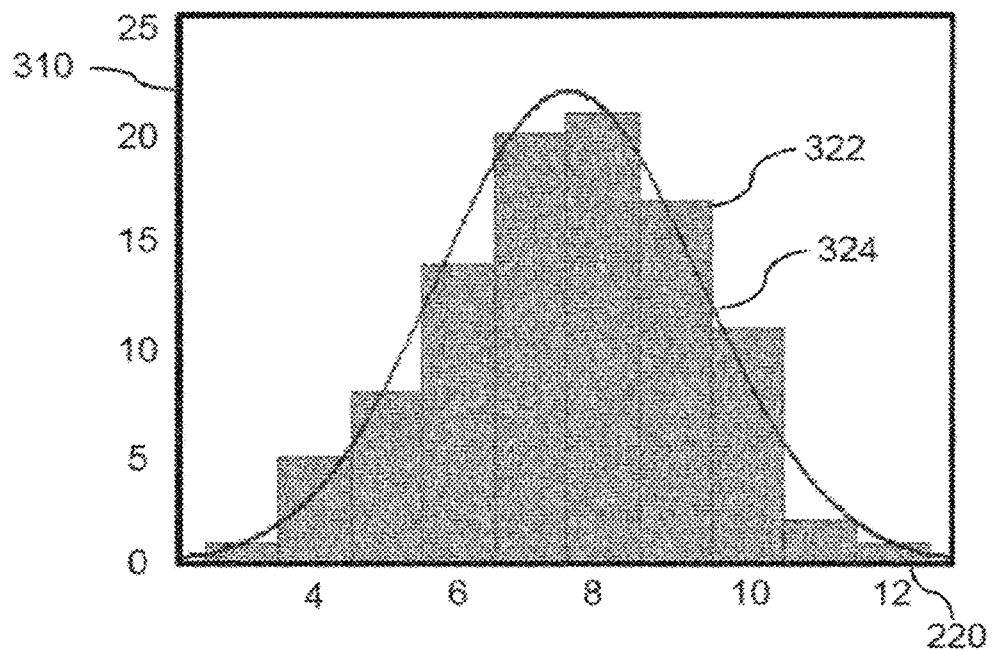
FIG. 3 the distribution of the particles shown in FIG. 2 on the x and y detector

The theoretical concept of the particle measurement is explained by means of FIG. 1, FIG. 2, and FIG. 3.

FIG. 1 shows a number of detected particles per minute as function of the number of lasers. FIG. 1 shows that the combination of two or three lasers with a single detector as well as single detection electronics solution is technically feasible. Measuring all laser currents by means of one detector in combination with single detection electronics increases the noise in the system. However, model calculations show that the advantage of multiple measurement beams is larger as the disadvantage of the additional noise. Multiple lasers with common detector and ASIC (e.g., evaluator 140 of FIG. 6) increase the number of detected particles as shown by curve 242. Curve 244 shows the reference in which one detector with one ASIC is used per laser.

By means of FIGS. 2 and 3 it is discussed that a reliable velocity measurement can be determined from the single photodetector signal. To explain this, it is assumed that the sensor is detecting above a flat area, in which the wind velocity is dominantly in the x,y plane. Normally, the wind speed would be derived by the square root of the velocity components in x and y direction. In the single detector 120 and evaluator 140 (photodiode/electronics) case, discrimination cannot be made between $v_x$ and $v_y$. It is only possible to determine an average velocity $v_{av}$ given by the equation.

$$v_{av} = \mathrm{sqrt}(2*(\Sigma v_i^2)/n)$$

$v_i$ is the absolute value of the i-th velocity as observed on the common detector 120 in combination with the common evaluator 140 (photodiode in combination with the ASIC) and n is the number of measurements given by the number of detected particles. In this case use is made from the fact that velocity changes are slow with respect to the particle detection rate. In case of a wind direction at 45 degrees an exact number for the average velocity is obtained despite of the fact that the discrimination between x and y direction is not possible. In case the wind direction is at 0 or 90 degrees the wind speed depends on the number of detected particles for each laser. For an identical number of particles per laser (both n/2), also an exact number for the air velocity would be derived. However, the number of detected particles per laser may be different. These statistical variations in number of detected particles will lead to velocity measurement errors. FIG. 2 shows the number of detected particles for a measurement time which on the average yields 15 detected particles. The standard deviation is 4 particles for n=15. FIG. 3 shows the binominal probability distribution over the x and y detector is given for 15 detected particles. Of course on the average 7.5 particles per laser 111, 112 are detected. The standard deviation is p(1−p)n=0.5*0.5*15=1.9 particles (p=0.5). For the worst case situation where the velocity is parallel to the x (or y) axis and the largest number of particles are observed in the zero velocity direction, the error in velocity is given by the equation:

$$\mathrm{sqrt}(2*(7.5*v^2)/15)/\mathrm{sqrt}(2*(5.6*v^2)/15) = 1.16 \text{ (For 1 sigma)}$$

Because the number of detected particles scales with the cubic root of the speed, the error in number of particles is 5% only. This error is much smaller as the particle detection error itself at 15 samples (25%, 1 sigma). This means that the velocity detection is for a lot of application accurately enough in case of a single detector 120 (e.g. photodiode) in combination with a single evaluator 140 (e.g. ASIC).

The average velocity is in case of a three dimensional configuration comprising three lasers 111, 112, 113 (as described above and below) determined by means of the equation:

$$v_{av} \mathrm{sqrt}(3*(\Sigma v_i^2)/n)$$

When the measurement beams 111', 112', 113' are not orthogonal with respect to each other, but enclose the same angle with each other (meaning the inner product of the direction vectors of the different lasers are the same), an estimate of the velocity vector coefficients can be made by applying a maximum likelihood method to the obtained velocities/frequencies to find the most likely coefficients for the velocities in the two or three laser basis. With these coefficients one can calculate the magnitude of the velocity vector.

$$|v|^2 = \sum_{ij} \alpha_i \alpha_j < e_i | e_j >$$

An error in the velocity estimation is made in this case. The magnitude of the velocity is modified by the Gram matrix G_ij=<e_j>. From the eigenvalues of this matrix the error made can be determined.

In short when all the measurement beams 111', 112', 113' enclose the same angle with each other the errors are minimal, for an angle of 90°. For e.g. 60° angle the error in the velocity estimation can be calculated as a factor of 2, which leads to error of cubic root of 2≈1.25 in PM2.5 estimate. It is thus preferred but not absolutely necessary that a two measurement beams 111', 112' in case of the two laser configuration or the three measurement beams 111', 112', 113' in case of the three laser configuration enclose an angle of 90°.

It is therefore possible to enable determination of the number of particles by means of two or three lasers 111, 112, 113 in combination with one detector 120. Furthermore, an optical device 150 is needed in order to redirect the measurement beams 111', 112', 113'. Examples of such optical devices 150 which are able to make focused beam in various directions while starting with lasers, especially VCSEL, closely together (e.g. 100 micron) on a chip are described below.

Figure 4:
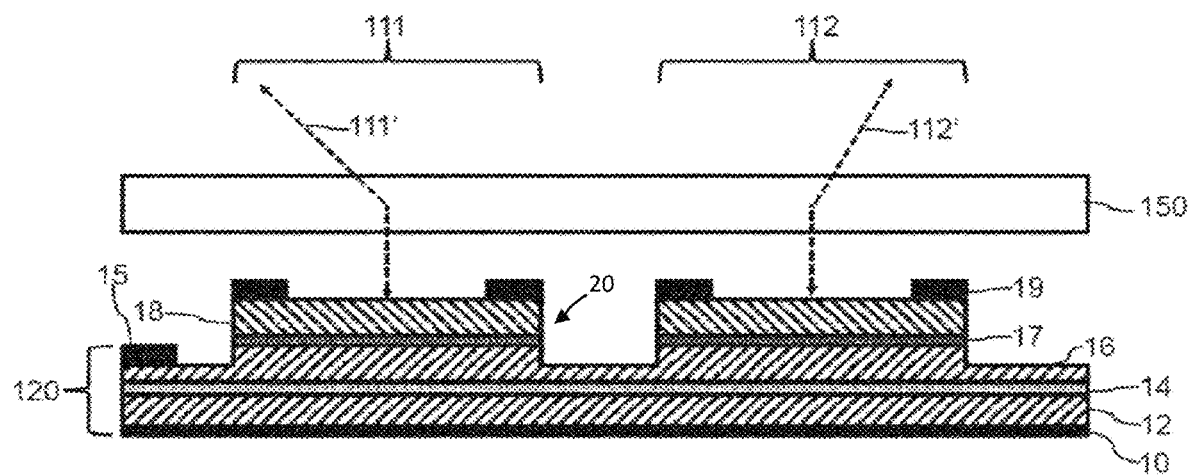
FIG. 4 shows a principal sketch of a first laser sensor module

FIG. 4 shows a principal sketch of a first laser sensor module. The first laser sensor module comprises two Vertical Cavity Surface Emitting Lasers (VCSEL) 111, 112. The two lasers 111, 112 are arranged on a common semiconductor substrate 12 and comprise a common bottom electrode 10. The first laser sensor module further comprises a detection layer 14 comprising one or more photosensitive layers which are arranged to determine variations of the optical standing wave in the laser cavities of the two lasers 111, 112. A photo current is measured by means of the common bottom electrode 10 and detection electrode 15. The corresponding laser cavity 20 of the first laser 111 and the second laser 112 are arranged in different mesas. Each of the lasers 111, 112 comprises a bottom Dielectric Bragg Reflector (DBR) 16, an active layer 17, a top DBR 18 and a top electrode 19. The laser cavity 20 of each of the first laser 111 and second laser 112 (or another laser such as laser 113 of FIG. 7) is formed by the associated bottom DBR 16, active laser 17, and top DBR 18 of the mesas of the corresponding laser. The top electrodes 19 of the two lasers 111, 112 are preferably electrically connected such that both lasers can be easily driven in parallel by providing an electrical driving current via the common bottom electrode 10 and the top electrodes 19. The first laser 111 is arranged to emit a first measurement beam 111'. The second laser 112 is arranged to emit a second measurement beam 112'. A common optical device 150 is arranged to redirect the first measurement beam 111' and the second measurement beam 112' such that the elongations of both redirected measurement beams 111', 112' enclose an angle of preferably 90° in a virtual intersection point if the measurement beams are arranged in the same plane. Direction vectors corresponding to the directions of the two measurement beams may span a plane which is preferably inclined to a plane coplanar to a two-dimensional particle flow (e.g. wind parallel to a surface) such that all components of the two-dimensional particle flow can be measured reliably.

Figure 5:
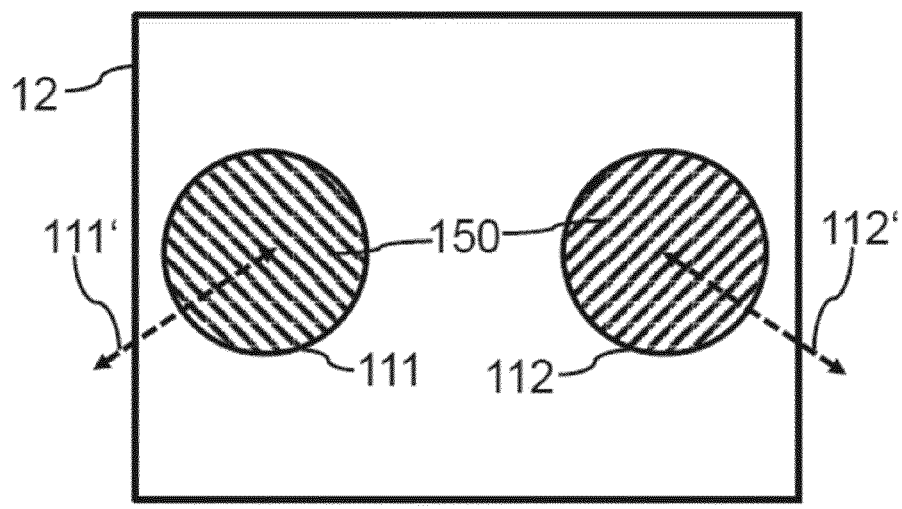
FIG. 5 shows a principal sketch of a second laser sensor module

FIG. 5 shows a principal sketch of a second laser sensor module. The configuration is the nearly the same as discussed with respect to FIG. 4. Two lasers 111, 112 (VCSEL) with surface gratings are arranged on a common substrate. The optical device 150 consists in this of the surface gratings. The surface gratings are arranged such that direction vectors in the emission directions of measurement beams 111', 112' enclose an angle of 90°. The measurement beams 111', 112' may be arranged in the same plane or parallel planes spanned by the direction vectors. The optical device 150 may optionally comprise further optical elements as, for example, lenses as described below.

Figure 6:
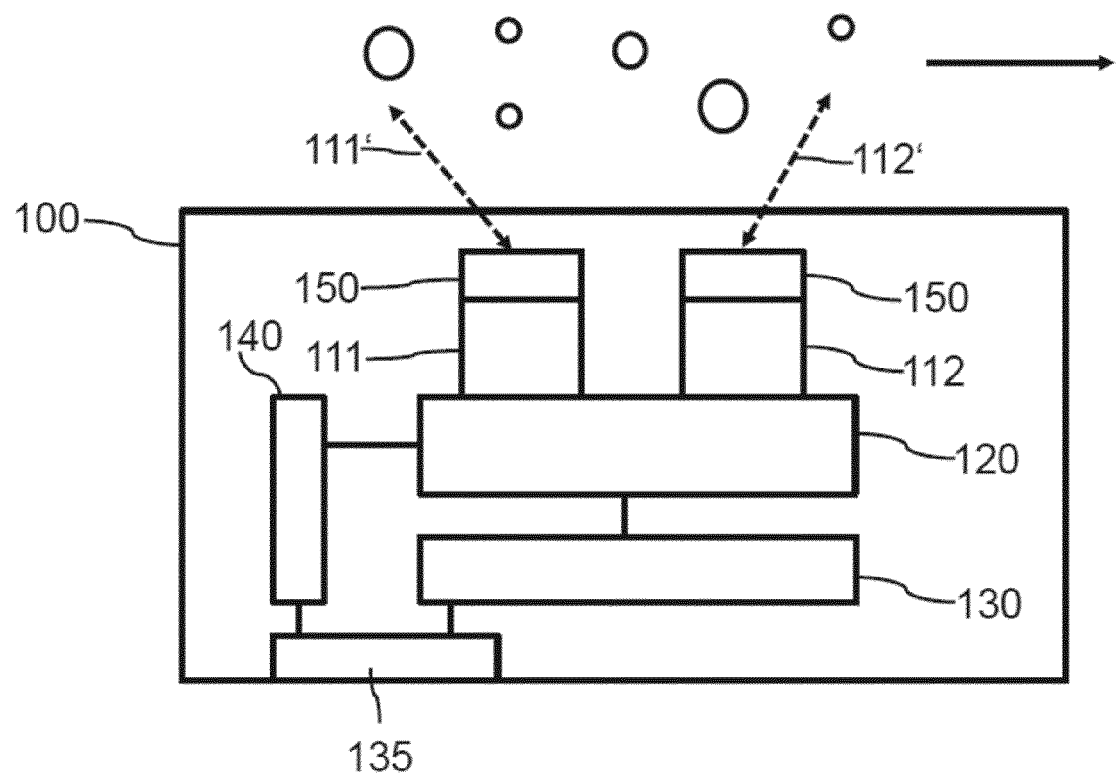
FIG. 6 shows a principal sketch of a first particle sensor

FIG. 6 shows a principal sketch of a first particle sensor 100. The first particle detector comprises a first laser 111 and a second laser 112. Both lasers 111, 112 may be side emitters which are arranged to emit laser light in the same direction. An optical device 150 is optically coupled with each laser 111, 112 in order to redirect the respective measurement beam 111', 112' as described above. The optical devices 150 comprise surface gratings for deflecting the measurement beams 111', 112'. The surface grating is manufactured by means of semiconductor processing in the production process of the lasers 111, 112 (e.g. VCSEL as shown in FIG. 4). Self-mixing interference signals may be generated after reflecting the first or second measurement beam 111', 112' by a particle comprised by a particle flow parallel to the surface of the first particle sensor 100. The self-mixing interference signals are detected by a common detector 120. The detected self-mixing interference signals are received and evaluated by means of an evaluator 140. The lasers 111, 112 are driven by means of electrical driver 130. Electrical measurement results generated by means of the evaluator 140 as well as electrical power may be provided by means of a common interface 135. Alternatively separate interfaces may be used.

Figure 7:
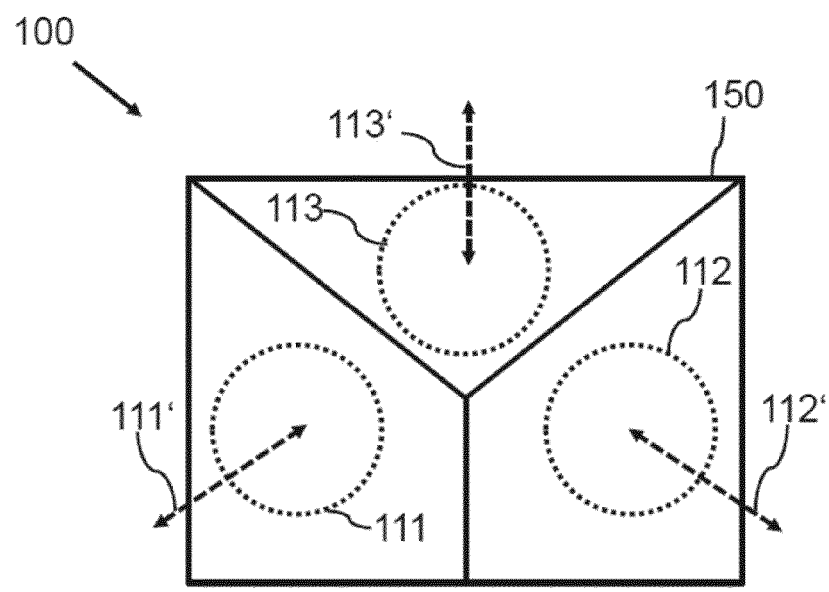
FIG. 7 shows a principal sketch of a top view of a second particle sensor

FIG. 7 shows a principal sketch of a top view of a second particle sensor 100. Three lasers 111, 112, 113 are arranged to emit measurement beams 111', 112', 113' in the same direction. An optical device 150 is in this case arranged such that the first measurement beam 111' and the second measurement beam 112' enclose the same angle as the second measurement beam 112' and the third measurement beam 113' and as the third measurement beam 113' and the first measurement beam 111'. The angle enclosed by the measurement beams 111', 112', 113' is preferably 90°. The second particle sensor 110 is therefore enabled to determine a three-dimensional average velocity. The second particle sensor 100 further comprises a common detector 120, an evaluator 140 and an electrical driver 130 and one or more interfaces as described above which are not shown. Optionally, the optical device 150 may comprise gratings optically coupled with each laser 111, 112, 113.

Figure 8:
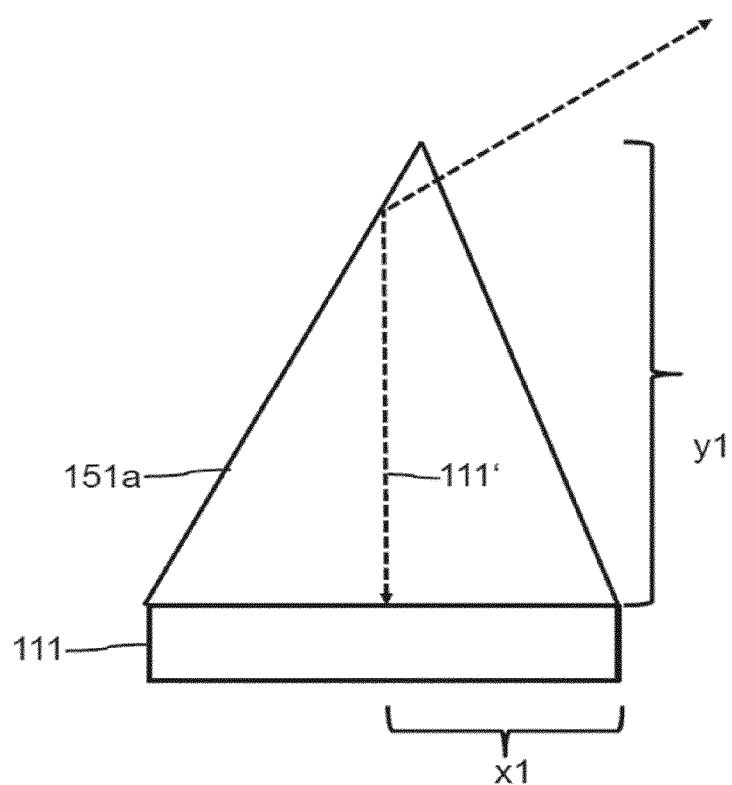
FIG. 8 shows a principal sketch of a first micro-optical component

FIG. 8 shows a principal sketch of a first micro-optical component 151a which may be comprised by the optical device 150. The micro-optical component 151a consists of a mirror on wafer level. For instance, 151a can be made of a UV-curing replica material. Also other technologies like glass molding or grinding are also possible. The mirror is in this case based on total internal reflection in order to redirect the first measurement been 111'. The distance x1 between the center of the first laser 111 and the edge of the first micro-optical component 151a is x1=0.05 mm. A height of the first micro-optical component 151a is y1=0.16 mm.

Figure 9:
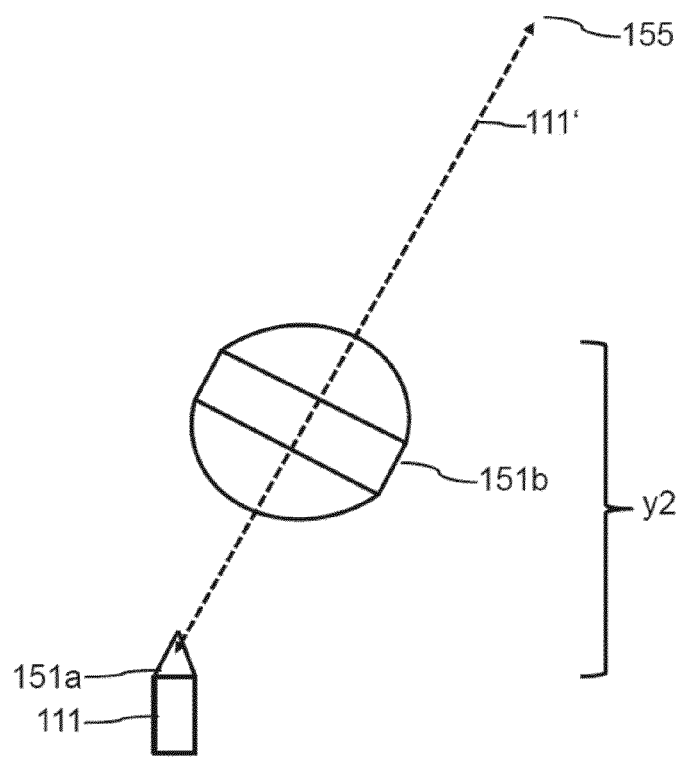
FIG. 9 shows a principal sketch of a first optical device

FIG. 9 shows a principal sketch of a part of a first optical device 150. The part comprises the first micro-optical component 151a and a focusing element 151b. The focusing element 151b is a lens with a size of less than 1 mm and the total height y2 of the part of the optical device is y2=1.1 mm. The lens is arranged to focus the first measurement beam 111' to focus region 155. Each of the lasers 111, 112, 113 is assigned to such a part of the first optical device 150. The first micro-optical component 151a and the focusing element 151b are shown as separate elements for clarity reasons. It may be preferred to integrate two or three of such first micro-optical components 151a and two or three of such focusing elements 151b in one integrated optical device 150. It is also possible that one focusing element 151b receives first measurement beams 111' from two, three, four or more first lasers 111 with associated first micro-optical component 151a such that, for example, an array of lasers can be used to emit a bundle of first measurement beams 111'. The same applies to the following configurations discussed with respect to FIGS. 9, 10, 11 and 12.

Figure 10:
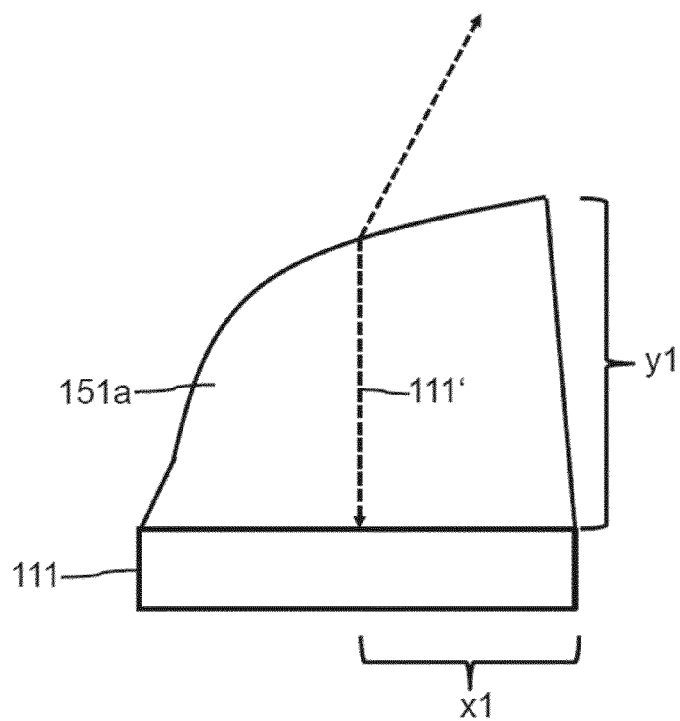
FIG. 10 shows a principal sketch of a second micro-optical component

FIG. 10 shows a principal sketch of a second micro-optical component 151a. The second micro-optical component 151a is in this case a toroidal micro-optical wedge which is optically coupled preferably attached to the first laser 111 such that the first measurement beam 111' is directed in the intended direction in order to enclose the predefined angle with the other second measurement beam 112' and in case of a three-dimensional laser sensor module also with the third measurement beam 113'. The distance x1 between the center of the first laser 111 and the edge of the second micro-optical component 151a is x1=0.04 mm. A height of the first micro-optical component 151a is y1=0.07 mm.

Figure 11:
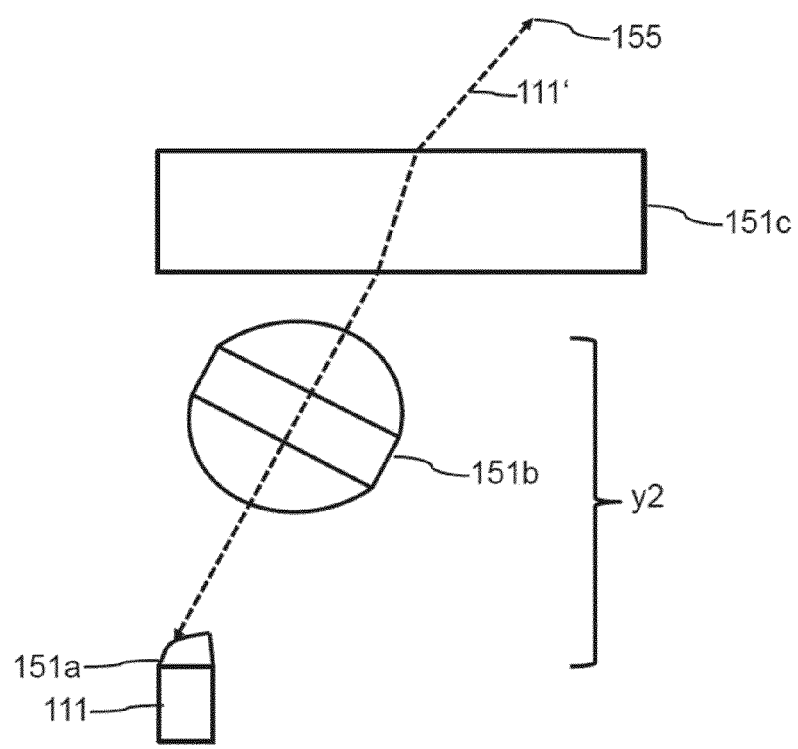
FIG. 11 shows a principal sketch of a second optical device

FIG. 11 shows a principal sketch of a part of a second optical device 150 comprising the second micro-optical component 151a described in FIG. 9, a second focusing element 151b and an optional measurement window 151c. The second focusing element 151b is a lens similar as discussed with respect to FIG. 8. The total height of the second micro-optical component 151a and the second focusing element 151b is y2=1.3 mm.

Figure 12:
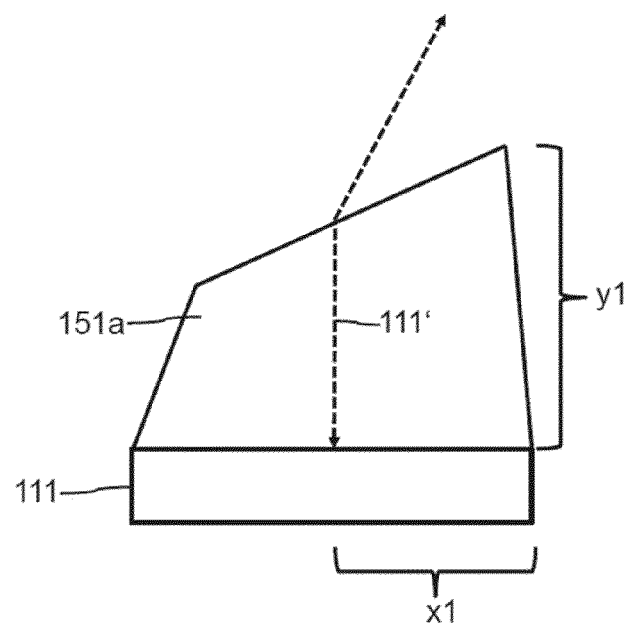
FIG. 12 shows a principal sketch of a third micro-optical component

FIG. 12 shows a principal sketch of a third micro-optical component 151a. The third micro-optical component 151a is in this case a replica wedge which is optically coupled preferably attached to the first laser 111 such that the first measurement beam 111' is directed in the intended direction. The distance x1 between the center of the first laser 111 and the edge of the second micro-optical component 151a is x1=0.04 mm. A height of the first micro-optical component 151a is y1=0.08 mm.

Figure 13:
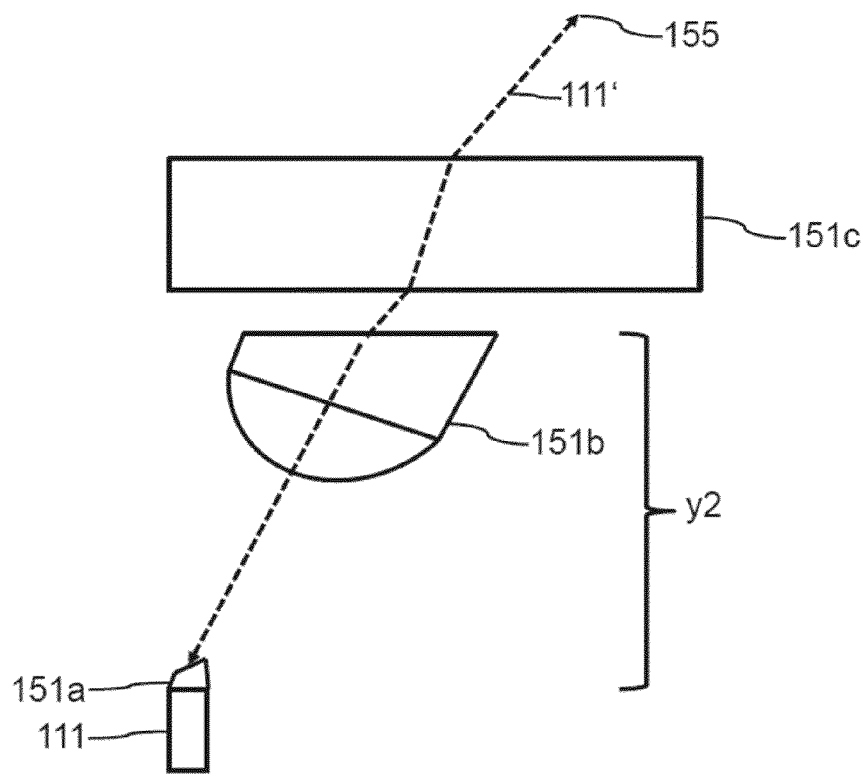
FIG. 13 shows a principal sketch of a third optical device

FIG. 13 shows a principal sketch of a part of a third optical device 150 comprising the third micro-optical component 151a described in FIG. 11, a third focusing element 151b and an optional measurement window 151c. The third focusing element 151b is a wedge lens the total height of the third micro-optical component 151a and the third focusing element 151b is y2=1.3 mm.

Figure 14:
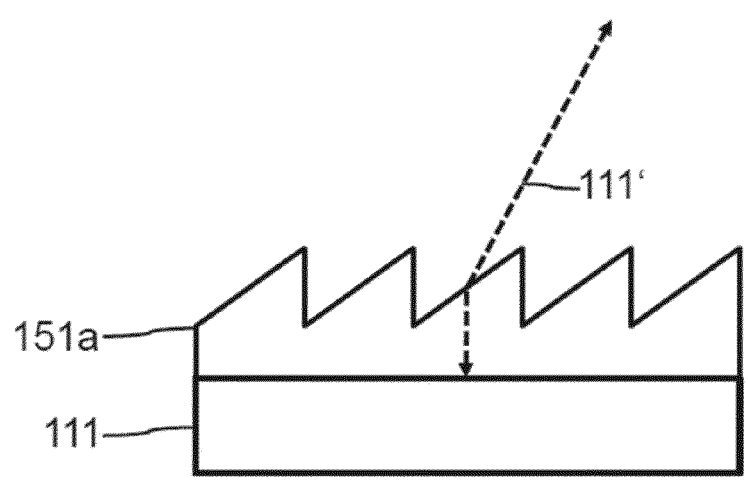
FIG. 14 shows a principal sketch of a fourth micro-optical component

FIG. 14 shows a principal sketch of a fourth micro-optical component 151a. The third micro-optical component 151a is in this case a blazed grating which may be optically coupled and attached to the first laser 111 such that the first measurement beam 111' is directed in the intended direction. This tilted grating structure may result in maximum efficiency in one diffracted order. The grating pitch is in the order of 1 micron. Blazed gratings may be placed in front of each laser at a different orientation in order to redirect the measurement beams 111', 112', 113' in the intended direction. The first optical device may comprise focusing elements 151b and an optional measurement window as described, for example, with respect to FIGS. 10 and 12.

Figure 15:
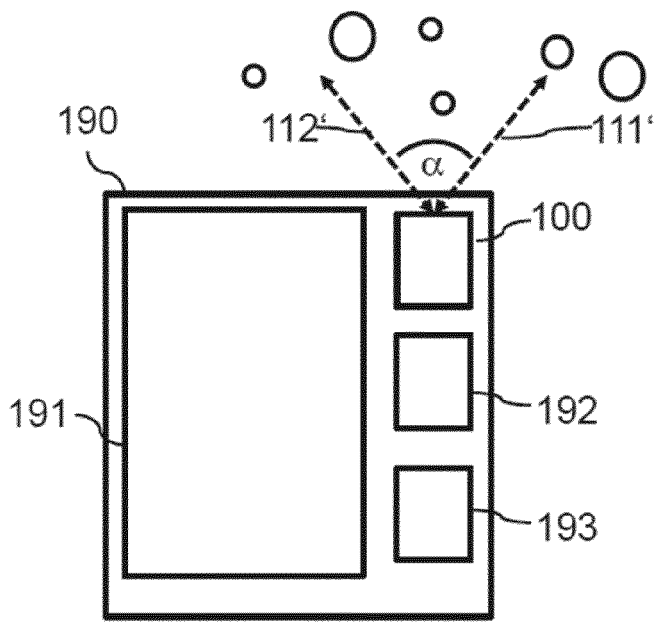
FIG. 15 shows a principal sketch of a mobile communication device

FIG. 15 shows a principal sketch of a mobile communication device 190 comprising a particle sensor 100. The particle sensor is adapted to emit a first measurement beam 111' and a second measurement beam 112' which enclose an angle α=90°. The mobile communication device 190 comprises a user interface 191, a processing device 192 and a main memory device 193. The main processing device 192 is connected with the main memory device 193 and with laser sensor module 100. The main processing device 192 comprises at least a part of the functionalities of evaluator 140 which are described above. The main processing device 192 stores data related to particle detection in the main memory device 193. In an alternative embodiment it may also be possible that the main processing device 192 and the main memory device 193 are only used to prepare or adapt data provided by means of the particle sensor 100 such that the data can be presented to a user of the mobile communication device 190 by means of user interface 191. The particle sensor 100 is powered by means of a power supply of the mobile communication device 190. The mobile communication device 190 may further comprise an orientation detection device (not shown). The orientation detection device may, for example, be adapted to determine the relative position of the mobile communication device 190 with respect to ground. The orientation detection device may be coupled with evaluator 140 or the main processing device in order to combine the data provided by means of the particle sensor 100 and data provided by means of the orientation detection device. Coupling of the orientation detection device and the particle sensor 100 may enable a more reliable detection of wind speed and particle density and may also provide information about wind direction.

Figure 16:
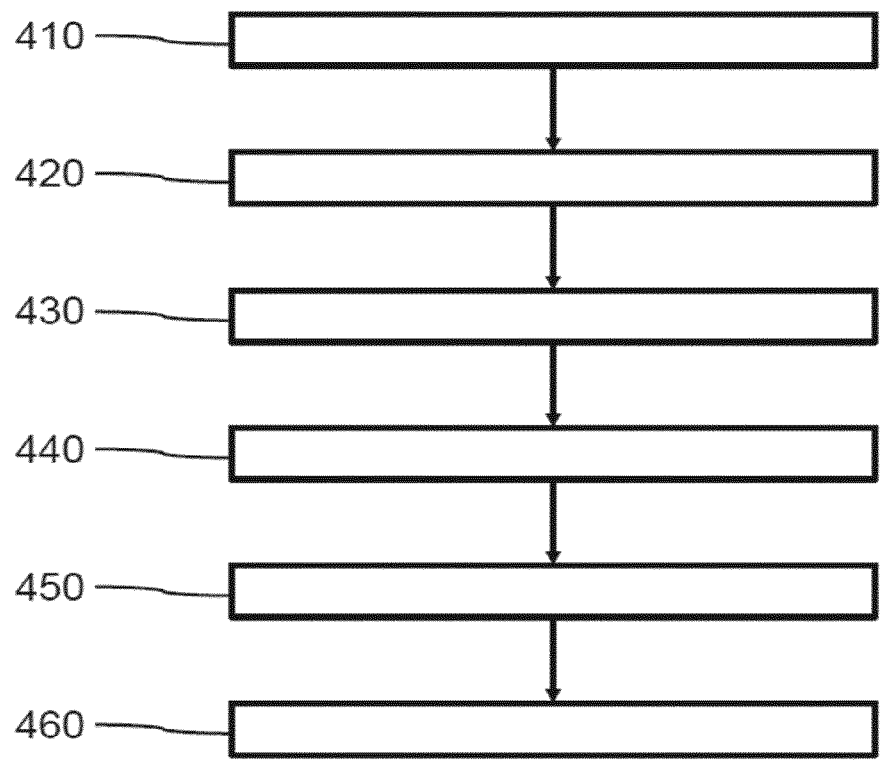
FIG. 16 shows a principal sketch of a method of particle detection

FIG. 16 shows a principal sketch of a method of particle detection. A first measurement beam 111' is emitted by means of a first laser 111 in step 410. A second measurement beam 112' is emitted by means of a second laser 112 in step 420. The first measurement beam 111' and the second measurement beam 112' are redirected in step 430 such that the first measurement beam 111' and the second measurement beam 112' enclose an angle between 45° and 135°. In step 440 self-mixing interference signals of a first optical wave within a first laser cavity of the first laser 111 and a second optical wave within a second laser cavity of the second laser 112 are determined by means of one detector 120 within a predetermined time period. At least one average velocity based on the determined self-mixing interference signals is determined in step 450. In step 460 a particle density is determined based on the determined average velocity and a number of determined self-mixing interference signals.

Figure 17:
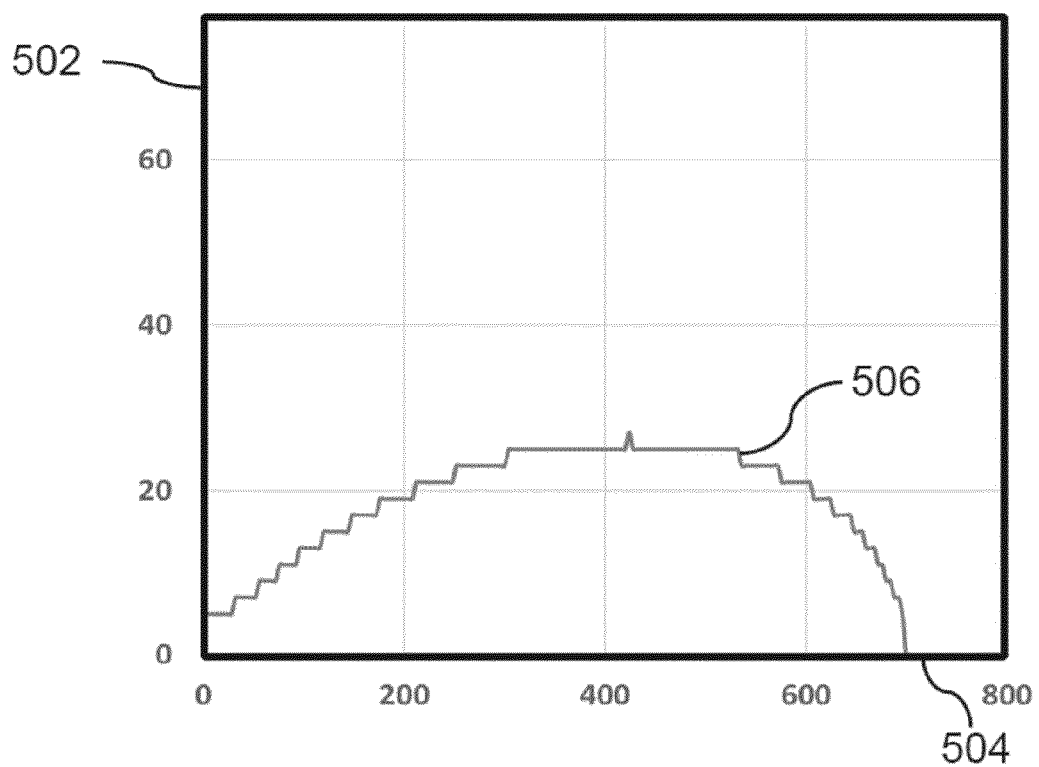
FIG. 17 shows 1 quadrant of an elliptical spot shape

FIG. 17 shows 1 quadrant of an elliptical spot shape 506. Determining the average velocity by the equation $$v_{av}\text{sqrt}(2*(\Sigma v_i^2)/n)$$

described above works well as long as the effective spot shape (cross-section perpendicular to emission direction of the respective measurement beam 111', 112', 113' in a measurement volume) is essentially circular. For optical systems with a practical NA for particle detection, typically the resulting spot has a very much elliptical cross-section as shown in FIG. 17 for NA=0.10. An extension along the y axis 502 and x axis (out of plane in this drawing) in a partial cross-section (upper right quadrant) of the spot shape perpendicular to the emission direction is in this example much smaller than an extension along the z axis 504 (note the difference in skales between the y axis 502 and the lowercase z axis 504). This results in large differences in the chance that a particle will be detected when it is travelling along the y axis 502 or the z axis 504. As a result, inaccuracies in the velocity measurements and consequently in the derived PM2.5 values are obtained. The inaccuracy depends on the angle that the particles are travelling with respect to two orthogonally placed sensors as discussed with respect to FIG. 18.

Figure 18:
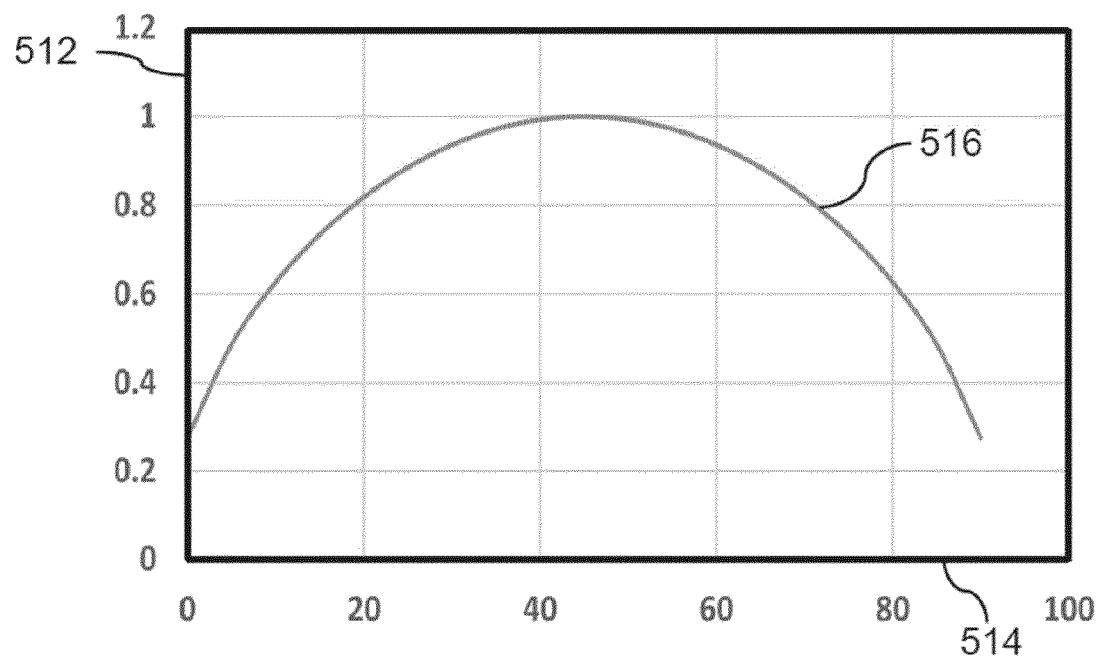
FIG. 18 shows an example of an error factor due to the elliptical spot shape

FIG. 18 shows an example of a dependence 516 of a error factor 512 on an angle between emission direction and particle trajectory 514 (angle in degree) due to the elliptical spot shape shown in FIG. 17. The numerical aperture (NA) of the optical device 150 of the laser sensor module or the particle sensor is in this example NA=0.1. At angle zero the particles travel along the optical axis of the first sensor, at angle 90 degree the particles travel along the optical axis of the second sensor ($\alpha$=90). The investigations have shown that the chance of hitting the optical beam due to the elliptical shape gets smaller, the time the particle travels in the beam increases. This is also clear from FIG. 17. When the particle travels along the z axis 504, the area for detection is relatively small. But the time the particle is travelling in the beam is relatively long. So by using $t^*v^2$ instead of $v^2$ for each measurement effectively a measure for the spot volume instead of spot cross section is used and the components in the x-, y-, and z-direction are taken into account with the proper weight.

$$v_{av}=\mathrm{sqrt}(2^*(\Sigma t_i^* v_i^2)/n^* t_{av}),$$

with $t_i$ the time of the i-th measurement (i-th particle), $v_i$ the measured velocity of the i-th particle and $t_{av}$= (t1+t2+ ... $t_i$ ... +tn)/n with n the number of all detected particles in the respective time period. The error factor due to elliptical beam is analysed again using the equation with the weight. In this case the elliptical beam shape was simplified by a rectangular box with dimensions having the maximum width and the maximum length of the shapes as given in FIG. 17. The time is determined from the distance travelling through this box as a function of angle. The result is given in FIG. 19.

Figure 19:
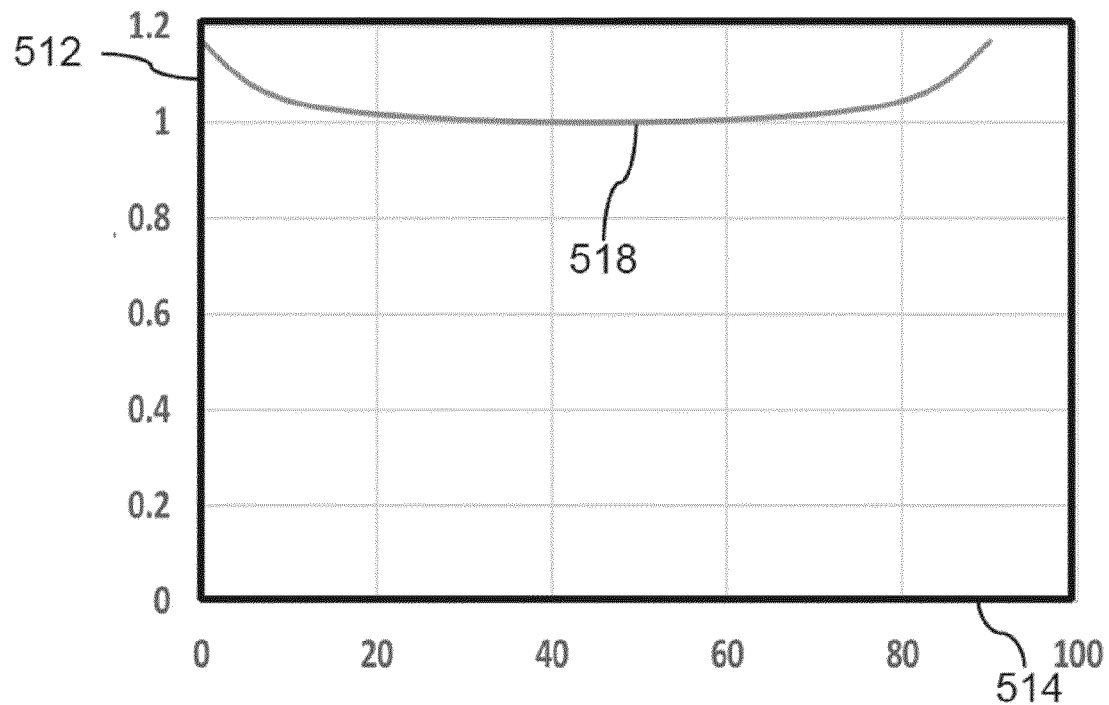
FIG. 19 shows reduction of the error factor taking into account elliptical spot shape In the Figures, like numbers refer to like objects throughout. Objects in the Figures are not necessarily drawn to scale.

FIG. 19 shows reduction of the error factor 512 as a function of the angle 514 (compensated error factor 518) taking into account elliptical spot shape by using the equation with the weight. The error factor 512 is reduced for all angles to less than 20%. The time t required to correct for the ellipticity is derived in the measurement by determination of the signal duration. This can be done in the time domain, but also in the frequency domain bij looking at the optimal blocksize for FFT detection of the particle. Evaluator 140 may therefore be arranged to compensate an ellipticity of the spot shape in the measurement volume (volume in which a particle crossing the respective measurement beam 111', 112', 113' provides sufficient feedback to generate a detectable self mixing interference signal) of the respective measurement beam 111', 112', 113'.

It is a basic idea of the present invention to provide a simple laser sensor module which comprises two or more lasers 111, 112, 113 preferably on one semiconductor chip and only one preferably integrated detector 120 in combination with an optical device 150 for particle detection. The optical device 150 redirects measurement beams 111', 112', 113' such that the measurement beams 111', 112', 113' all enclose the same angle of preferably 90°. This configuration enables determination of an average velocity of the particles despite of the fact that it is not possible to determine the components of the velocity vector. The introduced error by means of statistical variations is acceptable because the number of detected particles scales with the cubic root of the particle velocity. Consequently, the error in number of particles due to the error in the determined velocity is smaller than the error of the particle velocity.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

10 common bottom electrode
12 substrate
14 detection layer
15 detection electrode
16 bottom DBR
17 active layer
18 top DBR
19 top electrode
100 particle sensor
111 first laser
111' first measurement beam
112 second laser
112' second measurement beam
113 third laser
113' third measurement beam
120 detector
130 electrical driver
135 interface
140 evaluator
150 optical device
151a micro-optical component
151b focusing element
151c measurement window
155 focus region
160 air conditioning system
162 air mover
164 filter system
190 mobile communication device
191 user interface
192 main processing device
193 main memory device
230 number of particles per minute
240 number of lasers
242 detected particles in case of one detector for all lasers
244 detected particle in case of one detector per laser
210 probability
220 number of particles
222 probability of detecting corresponding number of particles 224 probability distribution function
310 frequency
322 frequency of detecting corresponding number of particles
324 distribution function of particles on the x and y detector
410 emitting first measurement beam
420 emitting second measurement beam
430 redirecting measurement beams
440 determining self-mixing interference signals
450 determining average velocity
460 determining particle density
502 extension along the y axis in micrometer
504 extension along the z axis in micrometer
506 elliptical spot shape
512 error factor
514 angle between emission direction and particle trajectory
516 error factor as function of angle
518 compensated error factor as function of angle
α angle enclosed by measurement beams
x1 radius of micro-optical component
y1 height of micro-optical component
y2 height of micro-optical component and focusing element

The invention claimed is:

1. A particle sensor comprising: a laser sensor, the laser sensor comprising:
at least a first laser, wherein the first laser is arranged to emit a first measurement beam;
at least a second laser, wherein the second laser is arranged to emit a second measurement beam;
an optical device, wherein the optical device is arranged to redirect at least the first measurement beam such that the first measurement beam and the second measurement beam enclose an angle between 45° and 135°,
a detector arranged being adapted to determine at least a first self-mixing interference signal of a first optical wave within a first laser cavity of the first laser and at least a second self-mixing interference signal of a second optical wave within a second laser cavity of the second laser; and
an evaluator circuit,
wherein the evaluator is arranged to receive detection signals generated by the detector in reaction to the determined self-mixing interference signals,
wherein the evaluator circuit is arranged to determine at least one average velocity of particles using the detection signals received in a predetermined time period,
wherein the evaluator circuit is arranged to determine a particle density based on a number of self-mixing interference signals determined in the predetermined time period and the at least one average velocity.

2. The particle sensor according to claim 1,
wherein the laser sensor module comprises at least a third laser,
wherein the third laser is arranged to emit a third measurement beam,
wherein the optical device is arranged to redirect at least two of the three measurement beams such that the redirected measurement beams mutually enclose the same angle,
wherein the detector is arranged to determine at least a third self-mixing interference signal of a third optical wave within a third laser cavity of the third laser.

3. The particle sensor according to claim 2, wherein the three measurement beams mutually enclose an angle of 90°.

4. The particle sensor according to claim 1, wherein the at least first laser and the at least second laser comprise semiconductor layers provided on a common semiconductor chip.

5. The particle sensor according to claim 4, wherein the detector is integrated in the semiconductor layers.

6. The particle sensor according to claim 1, wherein the optical device comprises a grating.

7. The particle sensor according to claim 4, wherein the optical device comprises a surface grating integrated in the semiconductor layers.

8. The particle sensor according to claim 2,
wherein the optical device comprises micro-optical components,
wherein the micro-optical components redirect the three measurement beams emitted by the three lasers, and
wherein each micro-optical component is attached to one of the three lasers.

9. The particle sensor according to claim 8,
wherein the optical device further comprises at least one focusing element associated with each of the three measurement beams,
wherein the at least one focusing element is arranged to focus the respective measurement beam on a focus region.

10. The particle sensor according to claim 2 further comprising an electrical driver, wherein the electrical driver is arranged to electrically drive the three lasers such that the each of the three lasers emit the three measurement beams.

11. An air purifier, a sensor box or a wearable device comprising the particle sensor according to claim 1.

12. A method of particle detection, the method comprising the steps of:
emitting at least a first measurement beam using a first laser,
emitting at least a second measurement beam using a second laser,
redirecting at least the first measurement beam such that the first measurement beam and the second measurement beam enclose an angle between 45° and 135°,
determining at least one self-mixing interference signals of a first optical wave within a first laser cavity of the first laser and at least a second optical wave within a second laser cavity of the second laser using a detector within a predetermined time period,
determining at least one average velocity based on the determined self-mixing interference signals,
determining a particle density based on the determined average velocity and a number of self-mixing interference signals determined within the predetermined time period.

13. The method according to claim 12:
determining at least a first average velocity based on self-mixing interference signals determined in a first time period,
determining at least a second average velocity based on self-mixing interference signals determined in a second time period,
determining the number of determined self-mixing interference signals in the predetermined time period comprising the first and the second time period,
determining the particle density based on the at least first average velocity, the at least second average velocity and the corresponding number of determined self-mixing interference signals.

14. A computer program product comprising computer code wherein the computer code is arranged to perform the method according claim 12.

15. The method according to claim 12, emitting at least a third measurement beam using a third laser,
wherein an optical device is arranged to redirect at least two of the three measurement beams such that the redirected measurement beams mutually enclose the same angle; and determining at least at least a third self-mixing interference signal of a third optical wave within a third laser cavity of the third laser.

16. The method according to claim 15, wherein the three measurement beams mutually enclose an angle of 90°.

17. The method according to claim 12, wherein the at least first laser and the at least second laser comprise semiconductor layers provided on a common semiconductor chip.

18. The method according to claim 12, wherein the detector is integrated in the semiconductor layers.

19. The method according to claim 15, further comprising redirecting the three measurement beams emitted by the three lasers.

20. The method according to claim 15, further comprising focusing each measurement beam on a focus region.

* * * * *